US007642154B2

(12) United States Patent
Ko

(10) Patent No.: US 7,642,154 B2
(45) Date of Patent: Jan. 5, 2010

(54) BICMOS DEVICE AND METHOD OF MANUFACTURING A BICMOS DEVICE

(75) Inventor: Kwang Young Ko, Seoul (KR)

(73) Assignee: Dongbu HiTek Co., Ltd., Seoul (KR)

(*) Notice: Subject to any disclaimer, the term of this patent is extended or adjusted under 35 U.S.C. 154(b) by 159 days.

(21) Appl. No.: 11/553,698

(22) Filed: Oct. 27, 2006

(65) Prior Publication Data

US 2007/0099374 A1 May 3, 2007

(30) Foreign Application Priority Data

Oct. 28, 2005 (KR) ...................... 10-2005-0102125

(51) Int. Cl.
*H01L 21/8249* (2006.01)

(52) U.S. Cl. ....................... 438/234; 438/235; 438/329; 438/202; 438/203; 438/204; 438/205; 438/206; 438/207; 438/208; 438/209; 438/210; 257/401; 257/370; 257/565; 257/575; 257/E21.696; 257/E27.017

(58) Field of Classification Search ......... 438/202–210, 438/234–329; 257/370, E21.696, 401, 565, 257/575, E27.017
See application file for complete search history.

(56) References Cited

U.S. PATENT DOCUMENTS

| | | | | |
|---|---|---|---|---|
| 4,498,227 | A * | 2/1985 | Howell et al. | 438/310 |
| 5,407,844 | A * | 4/1995 | Smayling et al. | 438/234 |
| 6,156,602 | A * | 12/2000 | Shao et al. | 438/238 |
| 6,204,104 | B1 * | 3/2001 | Fujii | 438/234 |
| 6,440,811 | B1 * | 8/2002 | Coolbaugh et al. | 438/324 |
| 2004/0256678 | A1 | 12/2004 | Goshima et al. | |
| 2005/0098852 | A1 * | 5/2005 | Kerr et al. | 257/539 |

FOREIGN PATENT DOCUMENTS

| | | |
|---|---|---|
| CN | 1536667 | 10/2004 |

* cited by examiner

*Primary Examiner*—Davienne Monbleau
*Assistant Examiner*—Hajar Kolahdouzan
(74) *Attorney, Agent, or Firm*—Sherr & Vaughn, PLLC

(57) ABSTRACT

A biCMOS device including a bipolar transistor and a Polysilicon/Insulator/Polysilicon (PIP) capacitor is disclosed. A biCMOS device may have a relatively low series resistance at a bipolar transistor. A bipolar transistor may have a desirable amplification rate.

10 Claims, 5 Drawing Sheets

BICMOS DEVICE AND METHOD OF MANUFACTURING A BICMOS DEVICE

The present application claims priority under 35 U.S.C. 119 and 35 U.S.C. 365 to Korean Patent Application No. 10-2005-0102125 (filed on Oct. 28, 2005), which is hereby incorporated by reference in its entirety.

BACKGROUND

A biCMOS device may have high speed, low power consumption, and high integration. A biCMOS device is a device (e.g. a chip) that includes both a bipolar transistor and a CMOS transistor. A biCMOS device may have low-power consumption characteristics and high-integration characteristics of CMOS transistors and high-speed switching characteristics and a high-current driving capabilities of bipolar transistors.

There is a variety of bipolar transistor manufacturing methods suitable for the biCMOS technology. These methods may be optimized to be compatible with CMOS transistor manufacturing methods, while maintaining high-speed switching characteristics and high-current driving capabilities. It may be desirable to integrate a Polysilicon/Insulator/Polysilicon (PIP) capacitor on a biCMOS device adjacent to a bipolar transistor. Integrating both a bipolar transistor and a PIP capacitor on a biCMOS device may be accomplished by a high-integration technique.

Example FIGS. 1A to 1D are cross-sectional views illustrating a method of manufacturing a biCMOS device having a bipolar transistor and a PIP capacitor. As illustrated in FIG. 1A, P-type semiconductor substrate 10 may include PIP capacitor region A and bipolar transistor region B. Semiconductor substrate 10 may include buried layer 12 (e.g. doped with an N-type material) formed in bipolar transistor region B. An epitaxial layer (not shown) may be formed on buried layer 12. First well region 14*a* (e.g. doped with N-type material) and second well region 14*b* (e.g. doped with P-type material) may be formed adjacent to each other within a epitaxial layer (not shown).

Field insulating layer 16 may be formed over surfaces of PIP capacitor region A and bipolar transistor region B. First polysilicon layer 18 may be formed over field insulating layer 16. A photoresist layer (not shown) may be formed over first polysilicon layer 18. Mask pattern 19 (e.g. for ion implantation) may be formed from a photoresist layer.

As illustrated in FIG. 1B, an ion implantation process using the mask pattern 19 may be performed by implanting ions into exposed areas of first polysilicon layer 18 to form doped first polysilicon layer 18*a*. As illustrated in FIG. 1C, mask pattern 19 may be stripped. First polysilicon layer 18 may be patterned so that only doped first polysilicon layer 18a remains. First polysilicon layer 18*a* may become a lower electrode of a PIP capacitor. Capacitor dielectric layer 20 and upper electrode 22 may be sequentially formed on doped first polysilicon layer 18*a*.

As illustrated in FIG. 1D, collector region 28 may be formed by doping a region of first well region 14*a* with N-type material. Emitter region 26 may be formed by doping a region of second well region 14*b* with N-type material. Base region 24 may be formed by doping a region of second well region 14*b* with P-type material. Base region 24 and emitter region 26 may be isolated from each other. Buried layer 12 and first well region 14*a* may work with collector region 28 in a bipolar transistor. Second well region 14*b* may work with base region 24.

A biCMOS device (e.g. a chip including a CMOS transistor and a bipolar transistor) may include the structure illustrated in FIGS. 1A through 1D. The concentration of N-type material in first well region 14*a* may be relatively low compared to a device that does not integrate CMOS transistors with bipolar transistors. Accordingly, it may be difficult to form a bipolar transistor having an adequate high amplification rate if the series resistance of collector region 28 is relatively high.

SUMMARY

Embodiments relate to a biCMOS device including a bipolar transistor and a Polysilicon/Insulator/Polysilicon (PIP) capacitor. In embodiments, a biCMOS device may have a relatively low series resistance at a bipolar transistor. A bipolar transistor may have a desirable amplification rate, according to embodiments.

In embodiments, a biCMOS device may include at least one of a semiconductor substrate, a first well region, a second well region, a doping region, and a bipolar transistor. A semiconductor substrate may be of a second conductive type. A first well region may be doped with a second conductive type material. A first well region may be formed in a predetermined region within a semiconductor substrate. A second well region may be doped with a first conductive type material. A second well region may be adjacent to the first well region. A doping region may be doped with the same conductive type as a first well region. A doping region may be formed within the first well region. A bipolar transistor may include an emitter region doped with a second conductive type material on a surface of a semiconductor substrate within the doping region.

Embodiments relate to a method of manufacturing a biCMOS device, including at least one of forming a first well region, forming a field insulating layer, depositing a first polysilicon layer, implanting ions, stripping a mask pattern, and forming a collector region. A first well region may be doped with a second conductive type. A second well region may be doped with a first conductive type. A field insulating layer may be formed on a surface of a semiconductor substrate between a first well region and a second well region. A first polysilicon layer may be formed on a field insulating layer. A mask pattern may be formed for ion implantation on a first polysilicon layer. Ions may be implanted of a first conductive type through a mask pattern. A doping region may be formed in a first well region of a bipolar transistor region while doping a first polysilicon layer of a PIP capacitor region. A mask pattern may be stripped for ion implantation. A collector region doped with a first conductive type may be formed on a surface of a semiconductor substrate within a doping region.

BRIEF DESCRIPTION OF THE DRAWINGS

Example

Example

Example

DETAILED DESCRIPTION

Figure 1A:
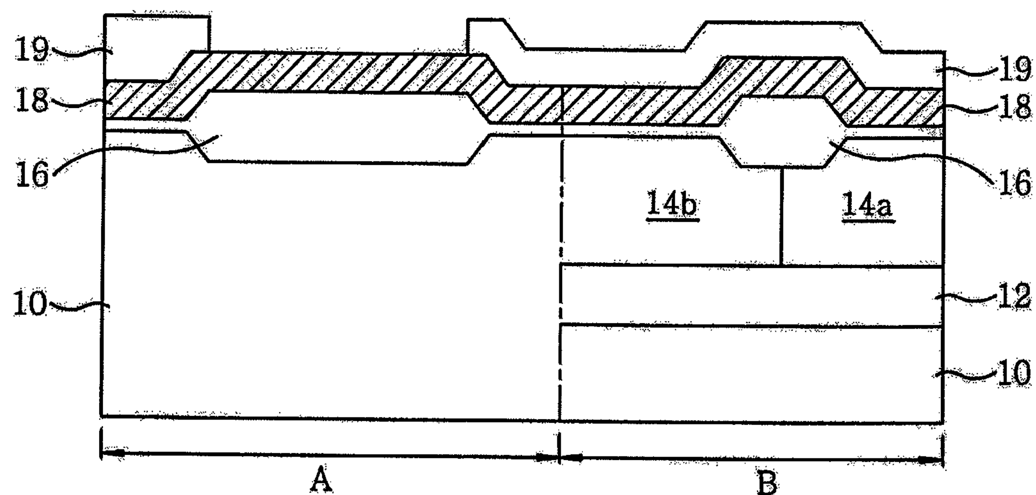
FIGS. 1A to 1D are cross-sectional views illustrating a method of manufacturing a biCMOS device.
Figure 1:
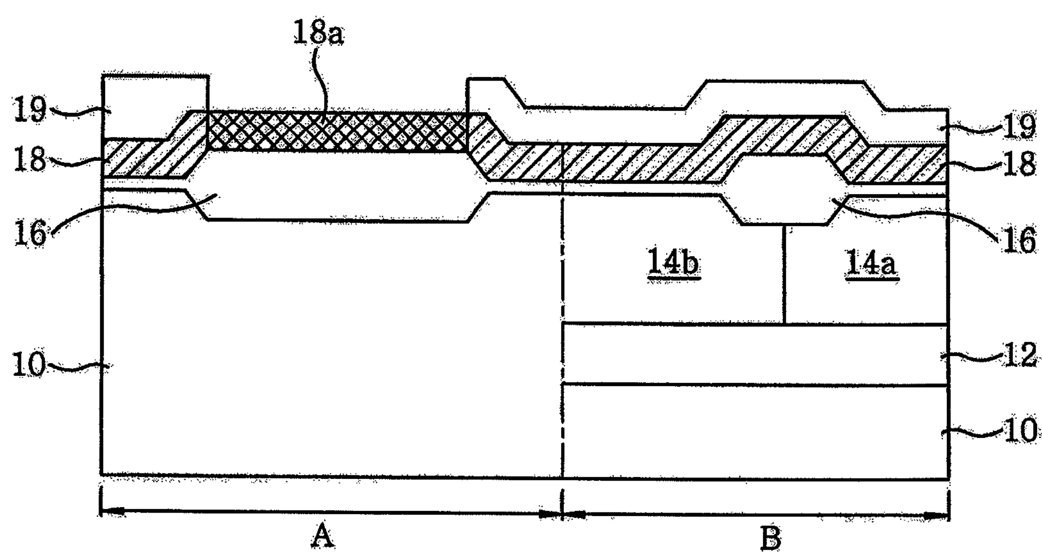
Figure 1C:
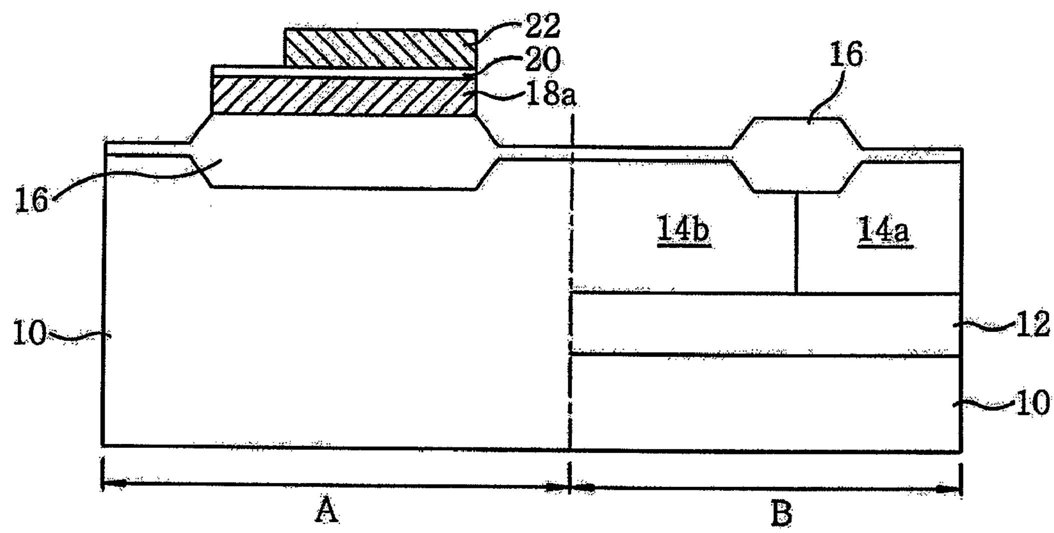
Figure 1D:
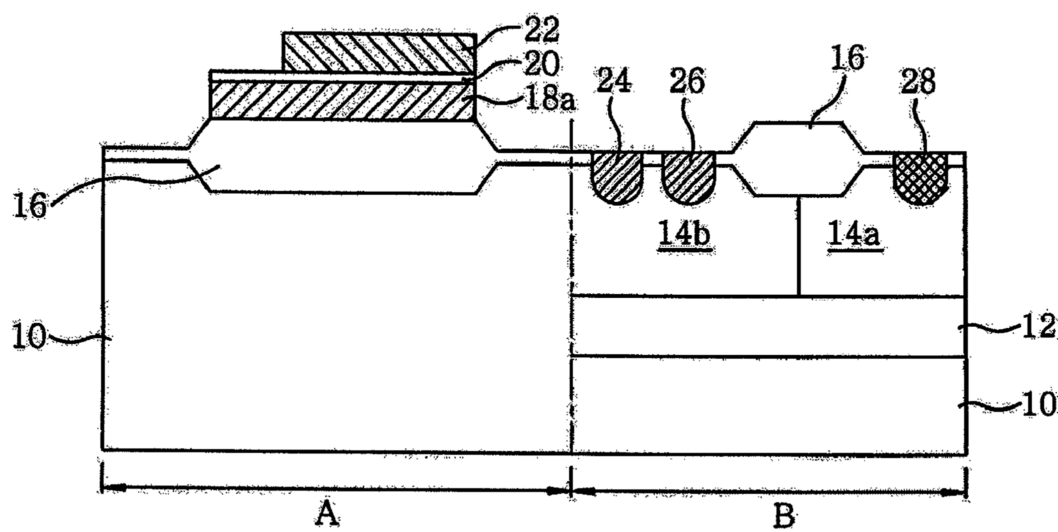
Figure 2:
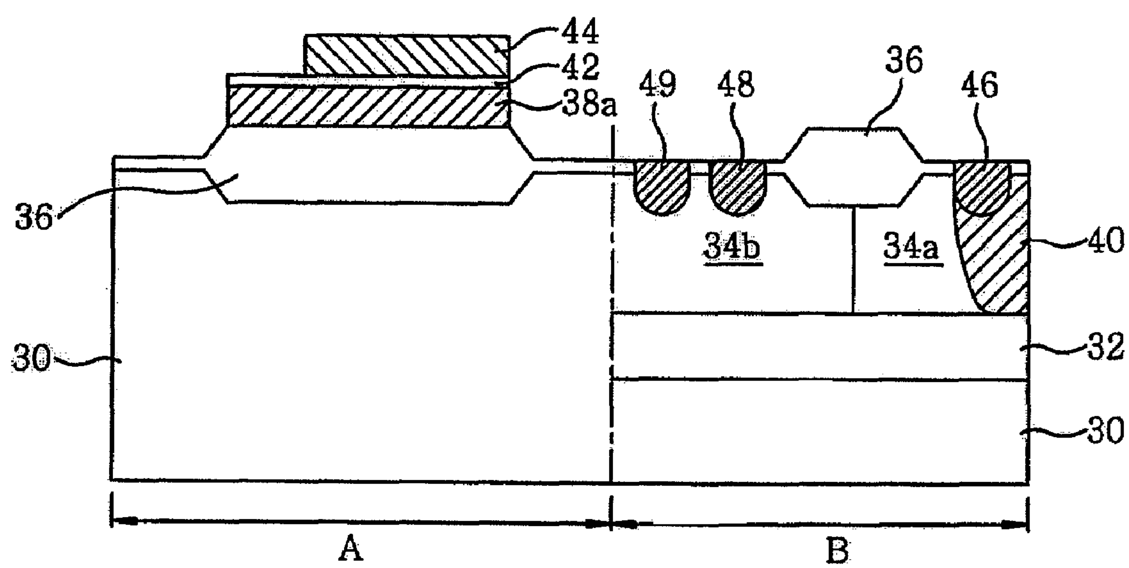
FIG. 2 is a cross-sectional view of a biCMOS device, according to embodiments.

Example FIG. 2 is a cross-sectional view of a biCMOS device having a PIP capacitor and a bipolar transistor, according to embodiments. FIGS. 3A to 3D are cross-sectional views illustrating a method of manufacturing a biCMOS device having a PIP capacitor and a bipolar transistor, according to embodiments. A biCMOS device may include a bipolar transistor and a PIP capacitor, in accordance with embodiments.

As illustrated in FIG. 2, a bipolar transistor may include buried layer 32 doped with a second conductive type material (e.g. N-type material) on semiconductor substrate 30. Semiconductor substrate 30 may be implanted with a first conductive type material (e.g. P-type material). An epitaxial layer (not shown) may be formed over buried layer 32.

First well region 34*a* (e.g. which may be doped with a second conductive type material) may be formed within an epitaxial layer (not shown). Second well region 34*b* (e.g. which may be doped with a first conductive type material) may be formed adjacent to first well region 34*a*.

In embodiments, doping region 40 may be formed within first well region 34*a*. Doping region 40 may be doped with a second conductive type material. Collector region 46 of a bipolar transistor may be formed on a surface of a semiconductor substrate in which doping region 40 is formed. In embodiments, series resistance of collector region 46 may be reduced by doping region 40. Accordingly, in embodiments, a bipolar transistor having a relatively high amplification rate can realized through use of doping region 40.

Emitter region 48 (e.g. which may be doped with a second conductive type material) may be formed on a surface of a semiconductor substrate in second well region 34*b*. Base region 49 (e.g. which may be doped with a first conductive type material) may be formed in second well region 34*b*. Base region 49 may be separated from emitter region 48. Field insulating layer 36 may be formed on a surface of a semiconductor substrate between first well region 34*a* and second well region 34*b*.

As illustrated in FIG. 2, a PIP capacitor may include field insulating layer 36 formed over semiconductor substrate 30. Lower electrode 38*a* (e.g. which may be doped with a second conductive type material), dielectric layer 42, and upper electrode 44 may be sequentially formed over field insulating layer 36.

Figure 3A:
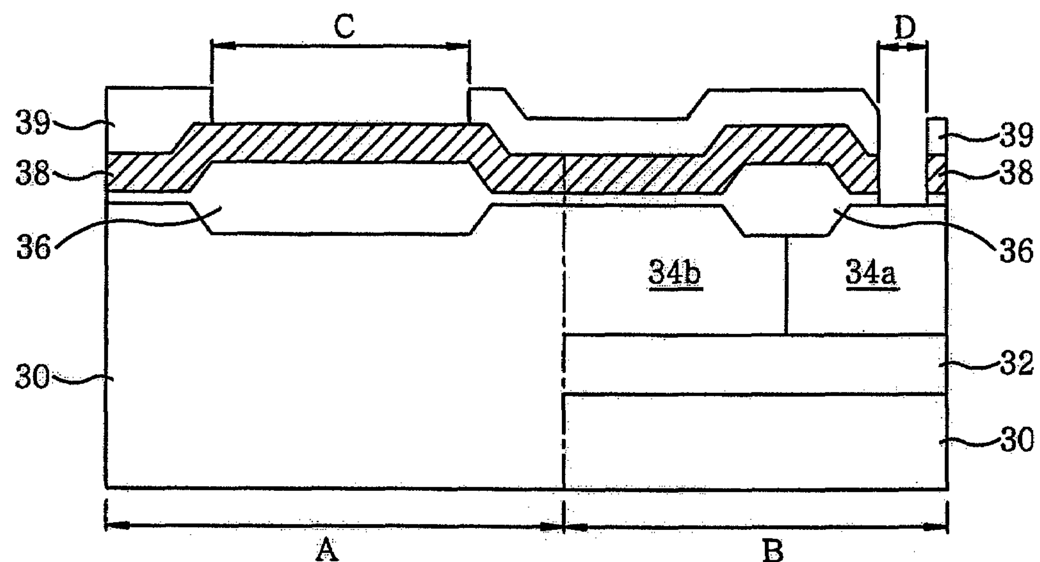
FIGS. 3A to 3D are cross-sectional views illustrating a method of manufacturing a biCMOS device, according to embodiments.

As illustrated in FIG. 3A, semiconductor substrate 30 may be implanted with a first conductive type material (e.g. a P-type material), in accordance with embodiments. Semiconductor substrate 30 may include a PIP capacitor in region A and a bipolar transistor in region B. Buried layer 32 may be doped with a second conductive type material (e.g. a N-type material). Buried layer 32 may be formed within bipolar transistor region B. An epitaxial layer (not shown) may be formed over buried layer 32. First well region 34*a* may be doped with a second conductive type material. Second well region 34*b* may be doped with a first conductive type material. First well region 34*a* and second well region 34*b* may be adjacent to each other and formed within an epitaxial layer (not shown). Field insulating layer 36 may be formed over semiconductor substrate 30.

First polysilicon layer 38 may be formed over field insulating layer 36. A photoresist layer (not shown) may be formed over first polysilicon layer 38. An exposure and development process may be performed to form mask pattern 39. Mask pattern 39 may be used for ion implantation.

Mask pattern 39 may be formed in order to expose a predetermined portion (e.g. a region D in which a collector region of a bipolar transistor will be formed) of first well region 34*a*. Mask pattern may be formed in order to expose region C of first polysilicon layer. To expose region D of first well region 34*a*, first polysilicon layer 38 below mask layer 39 may be stripped.

Figure 3B:
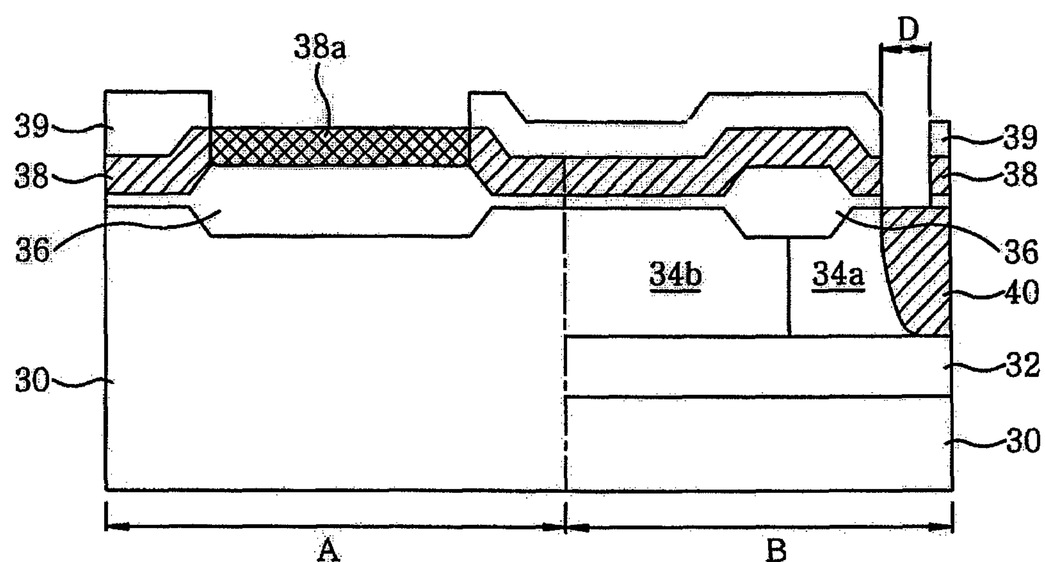

As illustrated in FIG. 3B, an ion implantation process using mask pattern 39 may be performed. First well region 34*a* may be doped to form doped region 40. First polysilicon layer 38 may be doped to form doped first polysilicon layer 38*a*. Doped first polysilicon layer 38*a* and doped region 40 may be doped at the same time.

Figure 3C:
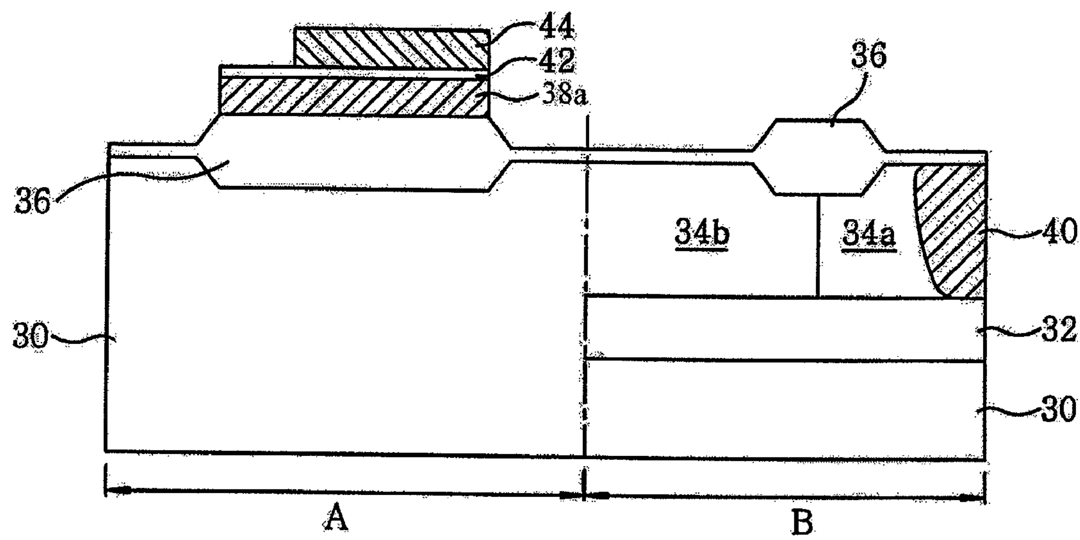

As illustrated in FIG. 3C, mask pattern 39 may be stripped. A photoresist layer coating, exposure, and development processes may be performed on doped first polysilicon layer 38*a* to form an etch-stop mask pattern (not shown). An etch process may be performed using an etch-stop mask pattern (not shown). An undoped region of first polysilicon layer 38 may be stripped with only doped first polysilicon layer 38*a* remaining. Doped first polysilicon layer 38*a* may become a lower electrode of a PIP capacitor. An etch-stop mask pattern (not shown) may then be stripped. A dielectric layer and a second polysilicon layer may be sequentially formed and patterned over doped first polysilicon layer 38*a* to form capacitor dielectric layer 42 and upper electrode 44.

Figure 3D:
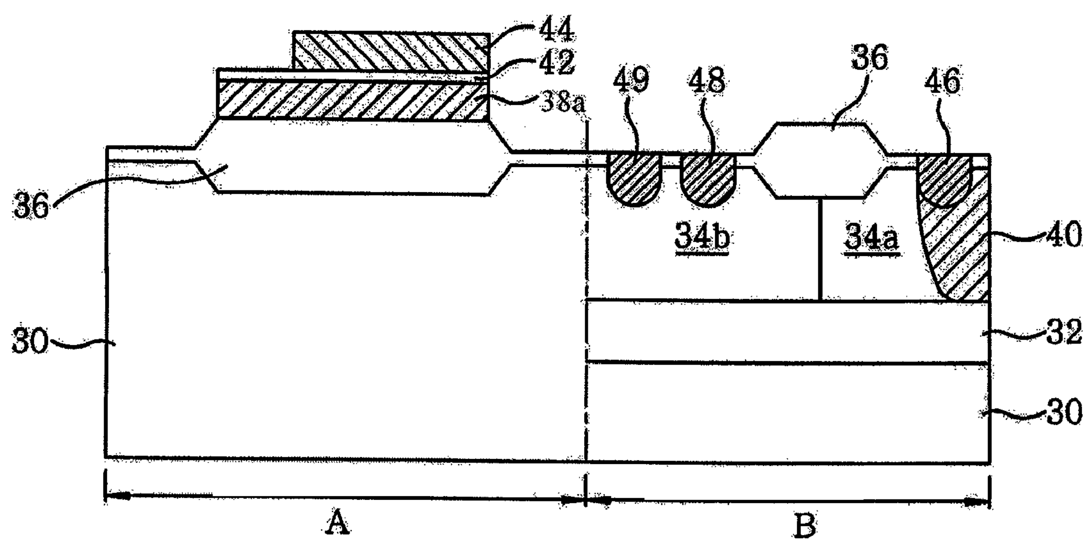

As illustrated in FIG. 3D, collector region 46 doped with a second conductive type material (e.g. N-type material) may be formed in doped region 40 of first well region 34*a*. Emitter region 48 may be doped with a second conductive type material (e.g. N-type material). Base region 49 may be doped with first conductive type material (e.g. P-type material). Emitter region 48 may be isolated from base region 49 in second well region 34*b*.

In embodiments, doped region 40 may be formed in first well region 34*a* to increase the concentration of second conductive type material in first well region 34*a*. Doped region 40 can work with collector region 46 during the operation of a bipolar transistor, in accordance with embodiments. In embodiments, a bipolar transistor may have a high amplification rate due to a relatively low series resistance in a collector region.

P-type material may be either first conductive type material or second conductive type material. N-type material may be either first conductive type material or second conductive type material.

It will be apparent to those skilled in the art that various modifications and variations can be made to embodiments. Thus, it is intended that embodiments cover modifications and variations thereof within the scope of the appended claims.

What is claimed is:

1. A method comprising:

forming a first well region doped with a second conductive type material and a second well region doped with a first conductive type material in a semiconductor substrate;

forming a field insulating layer over semiconductor substrate at a junction of the first well region and the second well region;

depositing a first polysilicon layer on the field insulating layer;

forming a mask pattern over the first polysilicon layer;

implanting ions of the second conductive type material using the mask pattern to form a doped region in the first well region;

implanting ions of the second conductive type material using the mask pattern to dope the first polysilicon layer in a capacitor region;

stripping the mask pattern; and forming a collector region doped with a second conductive type material in the doped region.

2. The method of claim 1, wherein the capacitor region comprises a Polysilicon/Insulator/Polysilicon (PIP) capacitor.

3. The method of claim 1, wherein the first well region and the second well region are comprised in a bipolar transistor.

4. The method of claim 1, comprising:

after said implanting the ions using the mask pattern, patterning the first well region to expose the first polysilicon layer; and forming a capacitor dielectric layer and an upper electrode over the first polysilicon layer.

5. The method of claim 1, comprising:

forming an emitter region with a second conductive type material in the second well region; and forming a base region with the first conductive type material in the second well region, wherein the base region is isolated from the emitter region.

6. The method of claim 1, wherein the first conductive type material is a P-type material and the second conductive type material is an N-type material.

7. The method of claim 1, comprising forming a buried layer within the semiconductor substrate before said forming the first well region and the second well region.

8. The method of claim 1, wherein the doped region is doped with a concentration of the second conductive type material greater than the concentration of the second conductive type material of the first well region.

9. The method of claim 1, wherein said implanting ions of the second conductive type material using the mask pattern to form a doped region in the first well region and said implanting ions of the second conductive type material using the mask pattern to dope the first polysilicon layer in a capacitor region are performed substantially simultaneously.

10. The method of claim 1, wherein said implanting ions of the second conductive type material using the mask pattern to form a doped region in the first well region is performed using the mask pattern and the first polysilicon layer disposed below the mask pattern.

* * * * *